United States Patent
Jo et al.

(10) Patent No.: US 7,636,009 B2
(45) Date of Patent: Dec. 22, 2009

(54) BIAS CURRENT GENERATING APPARATUS WITH ADJUSTABLE TEMPERATURE COEFFICIENT

(75) Inventors: Byeong Hak Jo, Gyunggi-do (KR); Yoo Sam Na, Seoul (KR); Kyoung Seok Park, Gyunggi-do (KR); Hyeon Seok Hwang, Seoul (KR); Seung Min Oh, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 39 days.

(21) Appl. No.: 12/014,041

(22) Filed: Jan. 14, 2008

(65) Prior Publication Data

US 2008/0180161 A1    Jul. 31, 2008

(30) Foreign Application Priority Data

Jan. 25, 2007    (KR) ............... 10-2007-0007896

(51) Int. Cl.
*G05F 1/10* (2006.01)
(52) U.S. Cl. .................... 327/539; 327/513
(58) Field of Classification Search .......... 327/513, 327/535, 537, 539
See application file for complete search history.

(56) References Cited

U.S. PATENT DOCUMENTS 6,906,581 B2 * 6/2005 Kang et al. ............... 327/539
7,301,321 B1 * 11/2007 Uang et al. ............... 323/313
7,495,505 B2 * 2/2009 Chang et al. ............. 327/539

OTHER PUBLICATIONS

Behzad Razavi, "Design of Analog CMOS Integrated Circuits", International Edition 2001 McGraw Hill, Chapter 11, pp. 381-382.

* cited by examiner

*Primary Examiner*—Jeffrey S Zweizig
(74) *Attorney, Agent, or Firm*—Lowe Hauptman Ham & Berner

(57) ABSTRACT

There is provided a bias current generating apparatus capable of providing a bias current where a characteristic change is compensated, to one of an analog circuit and RF circuit where various characteristic changes occur according to a temperature, by generating bias currents having a plurality of temperature coefficients. The apparatus includes: a positive temperature coefficient current generator generating a positive temperature coefficient current in direct proportion to an absolute temperature; a zero temperature coefficient current generator generating a zero temperature coefficient current constant regardless of the absolute temperature; and an adjustable temperature coefficient current generator generating and outputting an adjustable temperature coefficient current by amplifying the positive temperature coefficient current by A times, amplifying the zero temperature coefficient current by B times, adding the two amplified temperature coefficient currents, wherein a temperature coefficient of the adjustable temperature coefficient current is varied by adjusting sizes of the A and B.

14 Claims, 13 Drawing Sheets

BIAS CURRENT GENERATING APPARATUS WITH ADJUSTABLE TEMPERATURE COEFFICIENT

CROSS-REFERENCE TO RELATED APPLICATIONS

This application claims the priority of Korean Patent Application No. 2007-0007896 filed on Jan. 25, 2007, in the Korean Intellectual Property Office, the disclosure of which is incorporated herein by reference.

BACKGROUND OF THE INVENTION

1. Field of the Invention

The present invention relates to an apparatus for generating a bias current having an adjustable temperature coefficient, and more particularly, to a bias current generating apparatus capable of providing a bias current where a characteristic change is compensated, to one of an analog circuit and radio frequency (RF) circuit where various characteristic changes occur according to a temperature, by generating various bias currents having a plurality of temperature coefficients.

2. Description of the Related Art

In general, it is essential to provide performance of a circuit and an yield that stability with respect to a temperature, power voltage, and changes in process is provided in designing a complementary metal-oxide semiconductor (CMOS) analog or radio frequency (RF) circuit. Particularly, in such a stable circuit design, since a bias circuit is an element having a direct effect on performance of analog or RF circuit, it is very importance to provide stable operations of the bias circuit.

However, a transistor forming the analog or RF circuit has properties varying with a change in a temperature, there is required a bias circuit capable of stably complementing the change. A threshold voltage and mobility are greatest property of the transistor, which varies with a temperature change. Due to changes in the threshold voltage and mobility, transconductance of a metal-oxide semiconductor (MOS) transistor is changed. Generally, since transconductance decreases as a temperature is increased, a bias circuit capable of complementing the properties.

In general, as a method of complementing characteristic changes with respect to a temperature in designing a CMOS circuit, there is well-known technology of using a band gap reference circuit generating a stable bias current or voltage. A positive temperature coefficient (i.e. Proportional to Absolute Temperature: PTAT) circuit included in such band gap reference circuit has a positive temperature coefficient with respect to an absolute temperature. Accordingly, as a temperature is increased, a bias current or voltage increases. Applying the positive temperature coefficient circuit, it is possible to compensate a temperature in a limited range.

However, since a positive temperature coefficient circuit employed by a conventional band gap reference circuit has a fixed temperature coefficient, there is a limitation on being applied to a circuit having various variance properties. That is, analog or RF circuits include not only an MOS transistor but also a passive device such as a resistor. Such passive device also requires a temperature compensation circuit capable of varying a temperature coefficient. Also, since various circuits have different temperature coefficients of bias circuits, required for temperature compensation, there is required a temperature compensation circuit having various temperature coefficients.

As described above, in the art, there is required a temperature compensation bias circuit capable of providing a bias current where the characteristic changes are compensated, to various circuits having different characteristic changes according to a temperature.

SUMMARY OF THE INVENTION

An aspect of the present invention provides a bias current generating apparatus with an adjustable temperature coefficient, capable of generating a bias current having a plurality of temperature coefficients.

According to an aspect of the present invention, there is provided a bias current generating apparatus with an adjustable temperature coefficient, the apparatus including: a positive temperature coefficient current generator generating a positive temperature coefficient current in direct proportion to an absolute temperature; a zero temperature coefficient current generator generating a zero temperature coefficient current constant regardless of the absolute temperature; and an adjustable temperature coefficient current generator generating and outputting an adjustable temperature coefficient current by amplifying the positive temperature coefficient current by A times, amplifying the zero temperature coefficient current by B times, adding the two amplified temperature coefficient currents, wherein a temperature coefficient of the adjustable temperature coefficient current is selectively varied by adjusting sizes of the A and B.

The positive temperature coefficient current generator may include: first and second metal-oxide semiconductor field effect transistors (MOSFETs) having a source terminal connected to a power voltage; a first operation amplification unit having an input terminal connected to drain terminals of the first and second MOSFETs, respectively, and an output terminal connected to gate terminals of the first and second MOSFETs; a first bipolar junction transistor (BJT) having a base and a collector connected to the drain terminal of the first MOSFET and an emitter grounded; a first resistor having one terminal connected to the drain terminal of the second MOSFET; and a plurality of second BJTs having a base and a collector connected to another terminal of the first resistor and an emitter grounded, wherein a current flowing between the source terminal and the drain terminal of the first and second MOSFETs may be outputted as the positive temperature coefficient current.

The zero temperature coefficient current generator may include: a zero temperature coefficient voltage generation unit generating a zero temperature coefficient voltage constant regardless of the absolute temperature by using the positive temperature coefficient current; and a voltage-current conversion unit converting the zero temperature coefficient voltage into the zero temperature coefficient current and outputting the zero temperature coefficient current.

The zero temperature coefficient voltage generation unit may include: a third MOSFET having a drain terminal where the positive temperature coefficient current generated by the positive temperature coefficient current generator is applied to, a source terminal connected to the power voltage, and a gate terminal connected to the drain terminal; a fourth MOSFET having a source terminal connected to the power voltage and a gate terminal connected to the gate terminal of the third MOSFET; a second resistor having one terminal connected to a drain terminal of the fourth MOSFET; and a third BJT having a base and a collector connected to another terminal of the second resistor, and an emitter grounded, wherein a voltage of the drain terminal of the fourth MOSFET may be determined to be the zero temperature coefficient voltage regardless of the absolute temperature by adjusting resistance values of the first and second resistors and a number of the second BJTs.

The voltage-current conversion unit may include: a second operation amplification unit having one input terminal where a voltage of the drain terminal of the fourth MOSFET of the zero temperature coefficient voltage generation unit; a fifth MOSFET having a gate terminal connected to an output terminal of the second operation amplification unit and a source terminal connected to another input terminal of the second operation amplification unit; a sixth MOSFET having a source terminal connected to the power voltage and a gate terminal and a drain terminal connected to a drain terminal of the fifth MOSFET; a seventh MOSFET having a source terminal connected to the power voltage and a gate terminal connected to the gate terminal of the sixth MOSFET; and a third resistor having one terminal connected to the source terminal of the fifth MOSFET and another terminal grounded, wherein a current flowing through a drain terminal of the seventh MOSFET may be outputted as the zero temperature coefficient current.

The apparatus may further include an amplifier amplifying the positive temperature coefficient current by a predetermined gain. The gain may be determined to form a crossing point where a straight line indicating the positive temperature coefficient current crosses a straight line indicating the zero temperature coefficient current, in a normal temperature.

The adjustable temperature coefficient current generator may include: a first amplification unit amplifying the positive temperature coefficient current by the A times; a second amplification unit amplifying the zero temperature coefficient current by the B times; and an addition unit generating and outputting the adjustable temperature coefficient current by adding the amplified currents by the first and second amplification units, wherein the temperature coefficient of the adjustable temperature coefficient current may be determined by adjusting the sizes of the A and B.

The adjustable temperature coefficient current generator may include: a first amplification unit amplifying the positive temperature coefficient current by C+1 times; a second amplification unit amplifying the zero temperature coefficient current by C times; a third amplification unit amplifying the zero temperature coefficient current by D times; a subtraction unit subtracting the current amplified by the second amplification unit from the current amplified by the first amplification unit and outputting a current as a result thereof; and an addition unit generating and outputting the adjustable temperature coefficient current by adding the current outputted by the subtraction unit and a current outputted by the third amplification unit, wherein the sizes of the A and B may be determined by following Equation, $$A = C+1$$
$$B = D-C \qquad \text{Equation,}$$

and the temperature coefficient of the adjustable temperature coefficient current may be determined by adjusting sizes of the C and D.

The first amplification unit may be a current mirror circuit including: an eighth MOSFET having a drain terminal where the positive temperature coefficient current is applied to, a source terminal connected to the power voltage, and a gate terminal electrically connected to the drain terminal; and C+1 number of ninth MOSFETs having a gate terminal connected to the gate terminal of the eighth MOSFET, a source terminal connected to the power voltage, and a drain terminal connected to that of other ninth MOSFETs.

The second amplification unit may be a current mirror circuit including: a tenth MOSFET having a drain terminal where the zero temperature coefficient current is applied to, a source terminal connected to the power voltage, and a gate terminal electrically connected to the drain terminal; and C number of eleventh MOSFETs having a gate terminal connected to the gate terminal of the tenth MOSFET, a source terminal connected to the power voltage, and a drain terminal connected to that of other eleventh MOSFETs.

The third amplification unit may include: a current mirror circuit including a twelfth MOSFET having a drain terminal where the zero temperature coefficient current is applied to, a source terminal connected to the power voltage, and a gate terminal electrically connected to the drain terminal; and D number of thirteenth MOSFETs having a gate terminal connected to the gate terminal of the twelfth MOSFET, a source terminal connected to the power voltage, and a drain terminal connected to that of other thirteenth MOSFETs; and a mirror current circuit including a fourteenth MOSFET having a drain terminal where a current outputted from a common drain terminal of the thirteenth MOSFETs is applied to, a gate terminal electrically connected to the drain terminal, and a source terminal grounded; and a fifteenth MOSFET having a gate terminal connected to the gate terminal of the fourteenth MOSFET and a source terminal grounded.

The subtraction unit may include: a current mirror circuit including a sixteenth MOSFET having a drain terminal where a current outputted from the second amplification unit is inputted to, a gate terminal electrically connected to the drain terminal, and a source terminal grounded and a seventeenth MOSFET having a gate terminal connected to the gate terminal of the sixteenth MOSFET, and a source terminal grounded; and a current mirror circuit including an eighteenth MOSFET having a drain terminal where a current outputted from the first amplification unit is inputted to, the drain terminal connected to a drain terminal and the gate terminal of the seventeenth MOSFET, and a source terminal grounded and a nineteenth MOSFET having a gate terminal connected to a gate terminal of the eighteenth MOSFET and a source terminal grounded.

The addition unit may include: a current mirror circuit including a twentieth MOSFET having a drain terminal where the current outputted from the subtraction unit, a gate terminal electrically connected to the drain terminal, and a source terminal grounded and a twenty first MOSFET having a gate terminal connected to the gate terminal of the twentieth MOSFET and a source terminal connected to the power voltage; and a current mirror circuit including a twenty second MOSFET having a drain terminal where a current outputted from the third amplification unit is applied to, a gate terminal electrically connected to the drain terminal, and a source terminal connected to the power voltage and a twenty third MOSFET having a gate terminal connected to the gate terminal of the twenty second MOSFET, a source terminal connected to the power voltage, and a drain terminal connected to a drain terminal of the twenty first MOSFET, wherein a current outputted from a common drain terminal of the twenty first MOSFET and the twenty third MOSFET may be a current outputted from the adjustable temperature coefficient current generator.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiment set forth herein. Rather, these embodiments are provided so that this disclosure will be thorough and complete, and will fully convey the scope of the invention to those skilled in the art. Also, terms used in describing the embodiment of the present invention are defined by considering functions in the embodiment of the present invention, may vary with an intention of those skilled in the art or a usage thereof, and do not limit the scope of the technical features of the present invention.

Figure 1:
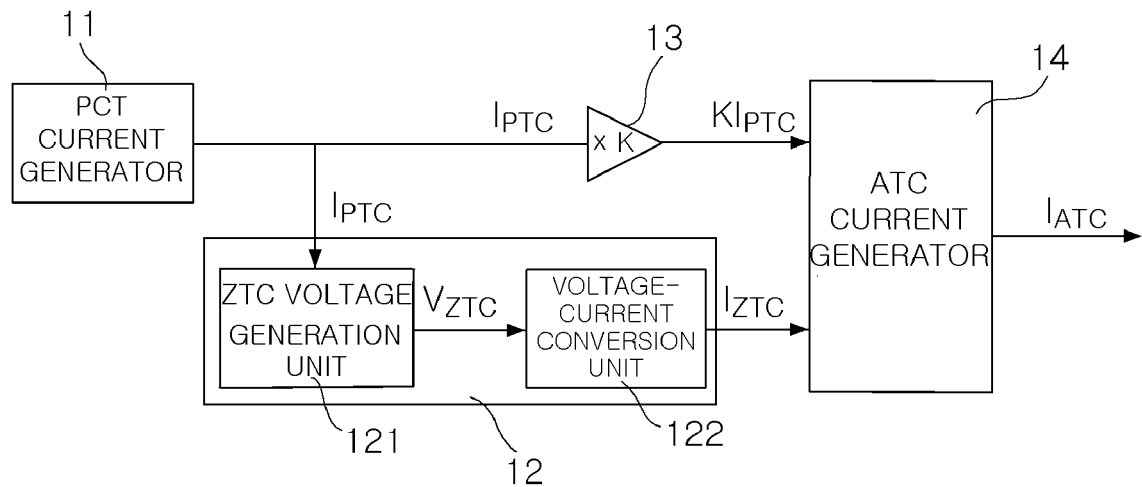
FIG. 1 is a block diagram illustrating a bias current generating apparatus having an adjustable temperature coefficient, according to an exemplary embodiment of the present invention.

FIG. 1 is a block diagram illustrating a bias current generating apparatus having an adjustable temperature coefficient, according to an exemplary embodiment of the present invention, Referring to FIG. 1, the bias current generating apparatus includes a positive temperature coefficient (PTC) current generator 11, a zero temperature coefficient (ZTC) current generator 12, and an adjustable temperature coefficient (ATC) current generator 14.

The PTC current generator 11 generates a PTC current $I_{PTC}$ in proportional to an absolute temperature.

The ZTC current generator 12 generates a ZTC current $I_{ZTC}$ having a constant value regardless of the absolute temperature. The ZTC current generator 12 may include a ZTC voltage generation unit 121 receiving the PTC current $I_{PTC}$ generated by the PTC current generator 11 and generating a ZTC voltage $V_{ZTC}$ having a constant value regardless of the absolute temperature and a voltage-current conversion unit 122 generating the ZTC current $I_{ZTC}$ by converting the ZTC voltage $V_{ZTC}$ into a current.

The ATC current generator 14 generates an ATC current $I_{ATC}$ by using the PTC current $I_{PTC}$ generated by the PTC current generator 11 and the ZTC current $I_{ZTC}$ generated by the ZTC current generator 12. The ATC current $I_{ATC}$ is a bias current that is an output of the bias current generating apparatus. The ATC current generator 14 generates the ATC current $I_{ATC}$ by adding the PTC current $I_{PTC}$ amplified by a predetermined gain and the ZTC current $I_{ZTC}$ amplified by a predetermined gain. A bias current with a desired temperature coefficient may be generated by appropriately determining amplification gains of the PTC current $I_{PTC}$ and the ZTC current $I_{ZTC}$.

Hereinafter, a detailed circuit structure of each element and function thereof will be described in detail.

Figure 2:
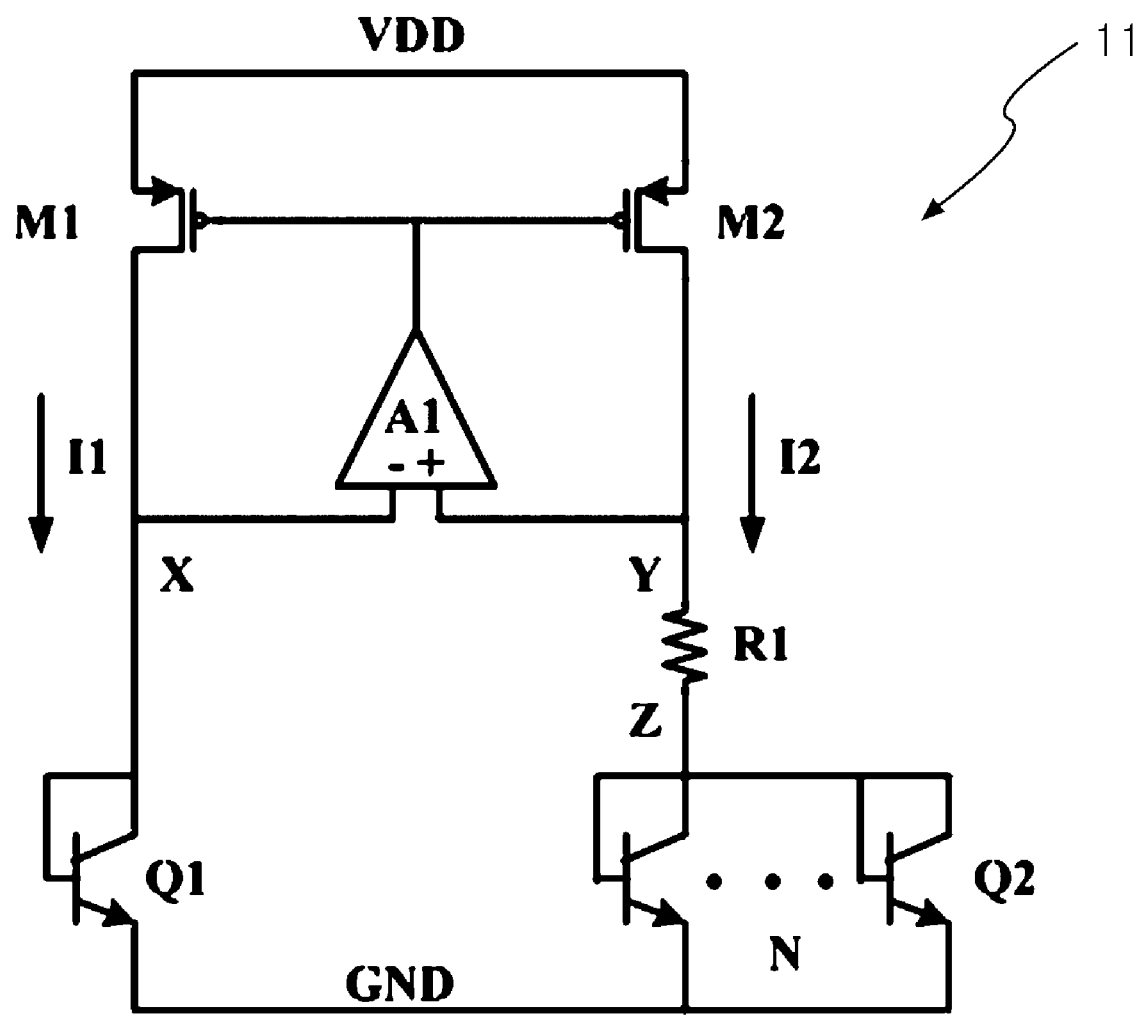
FIG. 2 is a circuit diagram illustrating a positive temperature coefficient current generator employed by an exemplary embodiment of the present invention.

FIG. 2 is a circuit diagram illustrating the PTC current generator 11 employed by an exemplary embodiment of the present invention.

Referring to FIG. 2, the PTC current generator 11 may include first and second metal-oxide semiconductor field effect transistors (MOSFETs) M1 and M2 having a source terminal connected to a power voltage VDD; a first operation amplification unit A1 having an input terminal connected to drain terminals of the first and second MOSFETs M1 and M2, respectively, and an output terminal connected to gate terminals of the first and second MOSFETs M1 and M2; a first bipolar junction transistor (BJT) Q1 having a base and a collector connected to the drain terminal of the first MOSFET M1 and an emitter grounded; a first resistor R1 having one terminal connected to the drain terminal of the second MOSFET M2; and a plurality of, n numbers of second BJTs having a base and a collector connected to another terminal of the first resistor R1 and an emitter grounded.

To describe functions of the PTC current generator 11 of FIG. 2, it will be known that a collector current of BJT may be expressed as following Equation 1.

$$I_C = I_S \exp(V_{BE}/V_T) \quad \text{Equation (1)}$$

wherein $I_S$ indicates a saturation current. $V_T$ is obtained by following Equation 2.

$$V_T = \frac{kT}{q} \quad \text{Equation (2)}$$

wherein k indicates a constant, T indicates an absolute temperature, and q indicates a unit amount of electric charges.

On the other hand, in a circuit of the PTC current generator 11, when the first MOSFET M1 has a size identical to that of the second MOSFET M2, currents I1 and I2 flowing from the source terminals to the drain terminal of the first and second MOSFETs M1 and M2 are identical to each other (I1=I2) and voltages of a node X and node Y are identical to each other due to the first operation amplification unit A1 (Vx=Vy).

In this case, the voltage Vx of the node X is a base-emitter voltage of the first BJT Q1, which may be expressed as following Equation 3.

$$Vx = V_{BE1} = V_T \ln \frac{I1}{I_S} \qquad \text{Equation (3)}$$

Also, the voltage Vy of the node Y is a sum of a voltage drop due to the first resistor R1 and a voltage drop due to the second BJT Q2, which may be expressed as following Equation 4.

$$Vy = I2R1 + V_{BE2} = I2R1 + V_T \ln \frac{I2}{NI_S} \qquad \text{Equation (4)}$$

When obtaining a current by using Equations 3 and 4 and a relation between I1=I2 and Vx=Vy, following Equation 5 may be deduced.

$$I1 = I2 = I = \frac{V_T \ln N}{R1} \qquad \text{Equation (5)}$$

According to Equation 5, a magnitude of the current has a PTC as following Equation 6.

$$\frac{\partial I}{\partial T} = \frac{1}{R1} \frac{k}{q} \ln N \qquad \text{Equation (6)}$$

That is, the current shown in Equation 6 may be used as the PTC current $I_{PTC}$ that is an output current of the PTC current generator 11.

Figure 3:
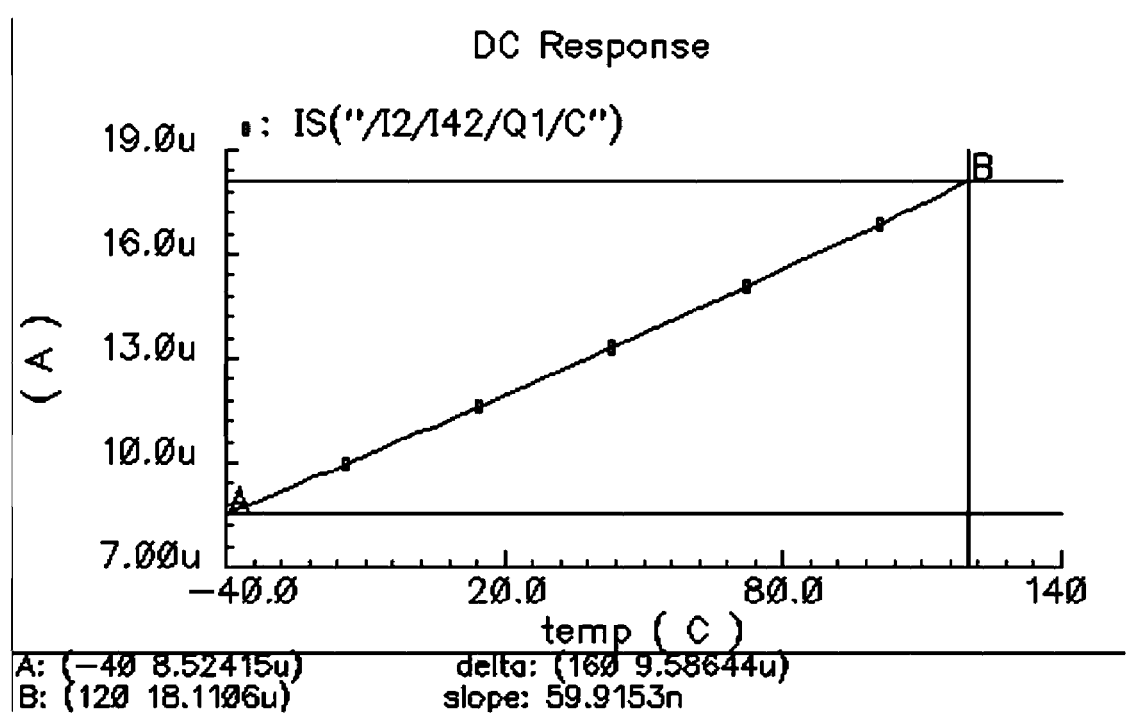
FIG. 3 is a graph illustrating current changes depending on a temperature in a current outputted from the positive temperature coefficient current generator of FIG. 2.

FIG. 3 is a graph illustrating a change in a PTC current $I_{PTC}$ according to a temperature when setting a number of the second BJTs Q2 as seven and a resistance value of the first resistor R1 as 4 kΩ. It may be known that a temperature coefficient of the PTC current $I_{PTC}$ shown in FIG. 3 is shown as +0.06 μA/K (K indicates the absolute temperature).

Figure 4:
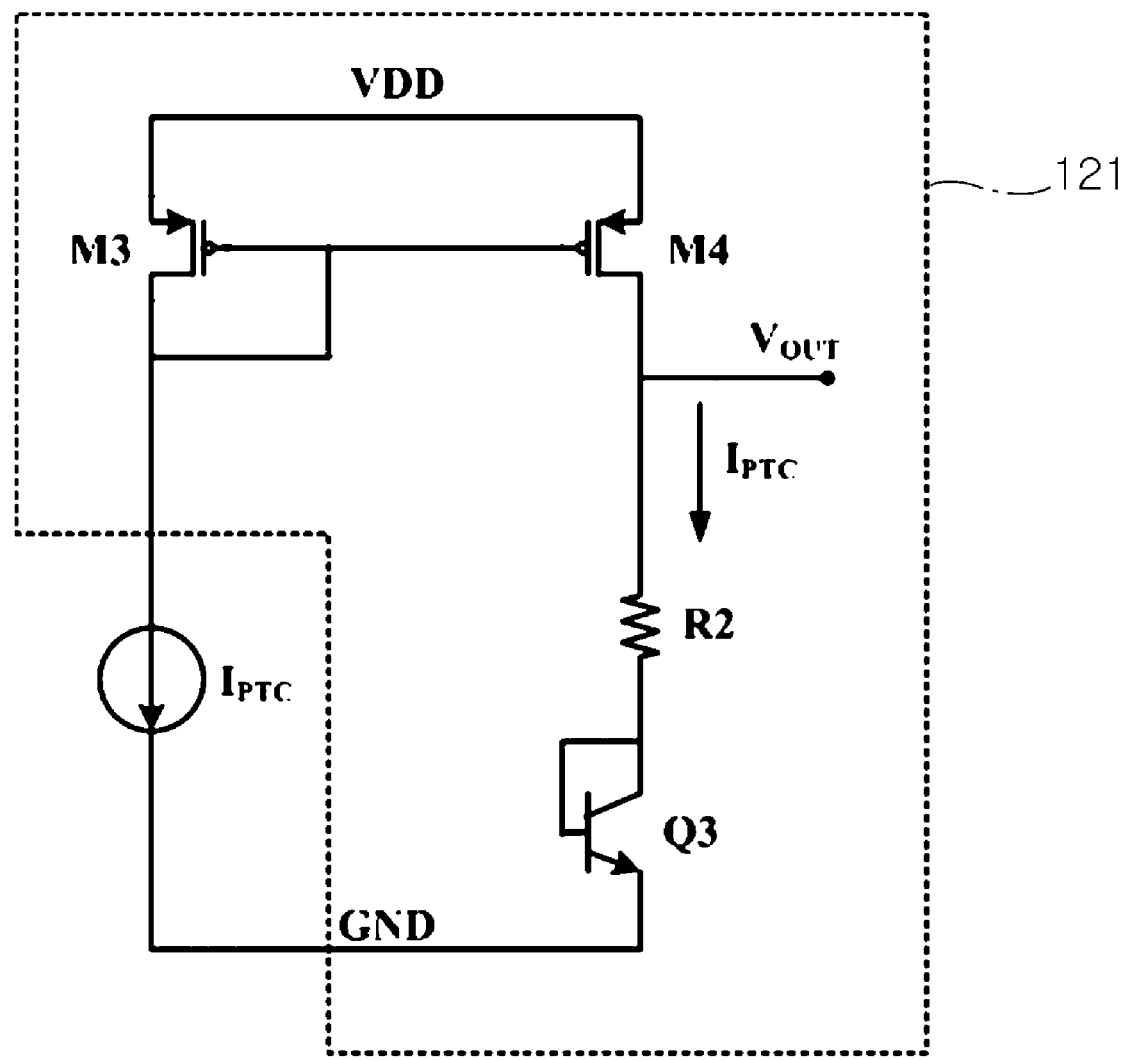
FIG. 4 is a circuit diagram illustrating a zero temperature coefficient voltage generation unit included in a zero temperature coefficient current generator employed by an exemplary embodiment of the present invention.

FIG. 4 is a circuit diagram illustrating the ZTC voltage generation unit 121 included in the ZTC current generator 12.

Referring to FIG. 4, the ZTC voltage generation unit 121 included in the ZTC current generator 12 may include a third MOSFET M3 having a drain terminal where the positive temperature coefficient current $I_{PTC}$ generated by the positive temperature coefficient current generator 11 is applied to, a source terminal connected to the power voltage VDD, and a gate terminal connected to the drain terminal; a fourth MOSFET M4 having a source terminal connected to the power voltage VDD and a gate terminal connected to the gate terminal of the third MOSFET M3; a second resistor R2 having one terminal connected to a drain terminal of the fourth MOSFET M4; and a third BJT Q3 having a base and a collector connected to another terminal of the second resistor R2, and an emitter grounded. In this case, a voltage of the drain terminal of the fourth MOSFET M4 may be determined to be the zero temperature coefficient voltage regardless of the absolute temperature by adjusting resistance values of the first and second resistors R2 and a number of the second BJTs Q2. The voltage of the drain terminal of the fourth MOSFET M4 becomes an output of the ZTC voltage generation unit 121.

Basically, the circuit shown in FIG. 4 has been known as a circuit having a property that a base-emitter voltage of the third BJT is decreased to approximately −1.5 mv/K according to a temperature (refer to "Design of Analog CMOS Integrated Circuits", Behzad Razavi, McGraw Hill, Chapter 11, pp 381-382). The PTC current $I_{PTC}$ of FIG. 2 is used as an input current in the circuit having such properties, manufacturing a circuit capable of outputting a constant voltage regardless of a temperature by compensating the property of decreasing according to a temperature.

When the PTC current $I_{PTC}$ generated by the PTC current generator 11 is applied to the drain terminal of the third MOSFET M3, a current having the same magnitude and mirrored by the third MOSFET M3 and the fourth MOSFET M4 flows between the source terminal and the drain terminal of the fourth MOSFET M3. In this case, to mirror the current having the same magnitude, the third MOSFET M3 and the fourth MOSFET M4 have the same size. In this case, a voltage of the drain terminal of the fourth MOSFET M4 may be expressed as following Equation 7 by Equation 5.

$$V_{out} = I_{PTC} R2 + V_{BE3} = \frac{V_T \ln N}{R1} R2 + V_{BE3} \qquad \text{Equation (7)}$$

wherein $V_{BE3}$ indicates the base-emitter voltage of the third BJT.

In Equation 7, a temperature characteristic of an output voltage of the circuit shown in FIG. 4 is expressed as following Equation 8.

$$\frac{\partial V_{out}}{\partial T} = \frac{\partial V_T}{\partial T} \frac{R2}{R1} \ln N + \frac{\partial V_{BE3}}{\partial T} \qquad \text{Equation (8)}$$

Figure 5:
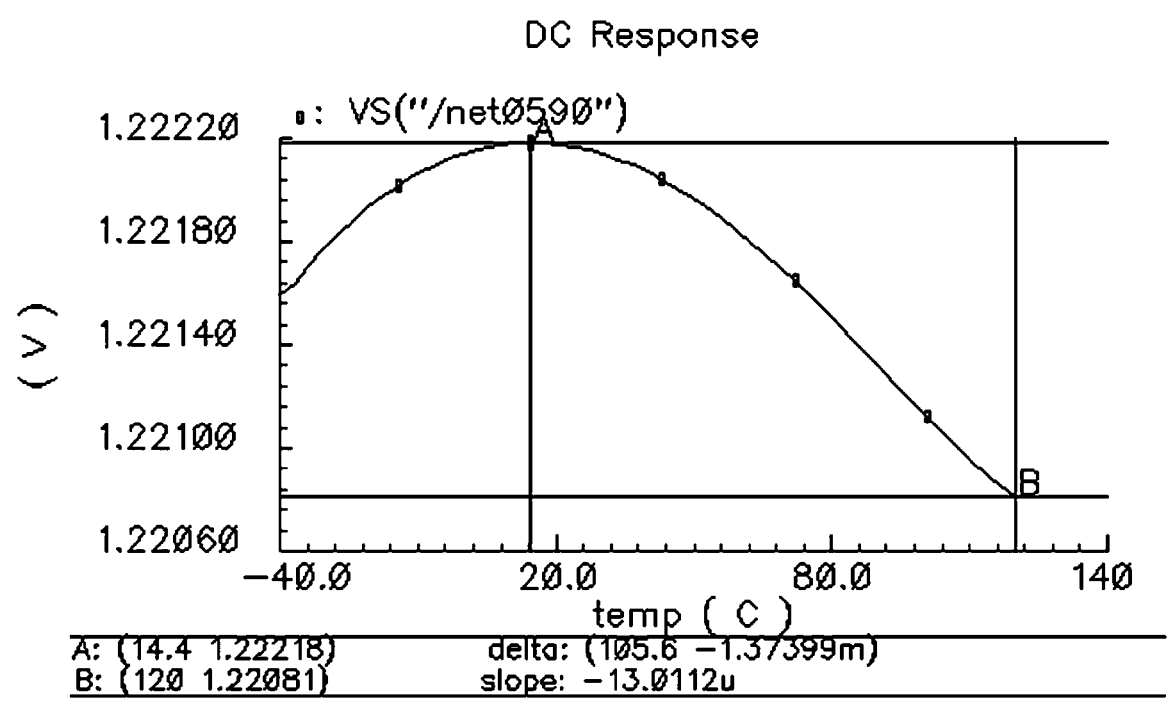
FIG. 5 is a graph illustrating current changes depending on a temperature in a current outputted from the zero temperature coefficient voltage generation unit of FIG. 4.

In Equation 8, since "$\partial V_T / \partial T$" has a positive temperature characteristic of +0.087 MV/K and "$\partial V_{BE3}/\partial T$" has a negative temperature characteristic of −1.5 mV/K, to allow the output voltage to have a constant ZTC regardless of the absolute temperature, the resistance values of the first and second resistors R1 and R2 and the number of the second BJTs should be appropriately adjusted in such a way that a value obtained by Equation 8 is 0. For example, when the resistance value of the first resistor R1 is determined as 4 kΩ and the number of the second BJTs is determined as seven, and the resistance value of the second resistor R2 is determined as 36 kΩ, a characteristic where a fluctuation range of the output voltage according to a temperature variance is close to 0 may be obtained as shown in FIG. 5. FIG. 5 is a graph illustrating a result of simulating the output voltage value $V_{OUT}$ of FIG. 4 when the resistance value of the first resistor R1 is determined 4 kΩ and the number of the second BJTs is determined as seven, and the resistance value of the second resistor R2 is determined as 36 kΩ. As shown in FIG. 5, by the circuit configuration of FIG. 4, regardless of temperature changes within a range from −40 to 120° C., there is shown just a change less than about 0.002 V in the output voltage $V_{OUT}$. That is, the range of fluctuation of the output voltage according to temperature changes may be considered as included in a range actually corresponding to 0 V.

Figure 6:
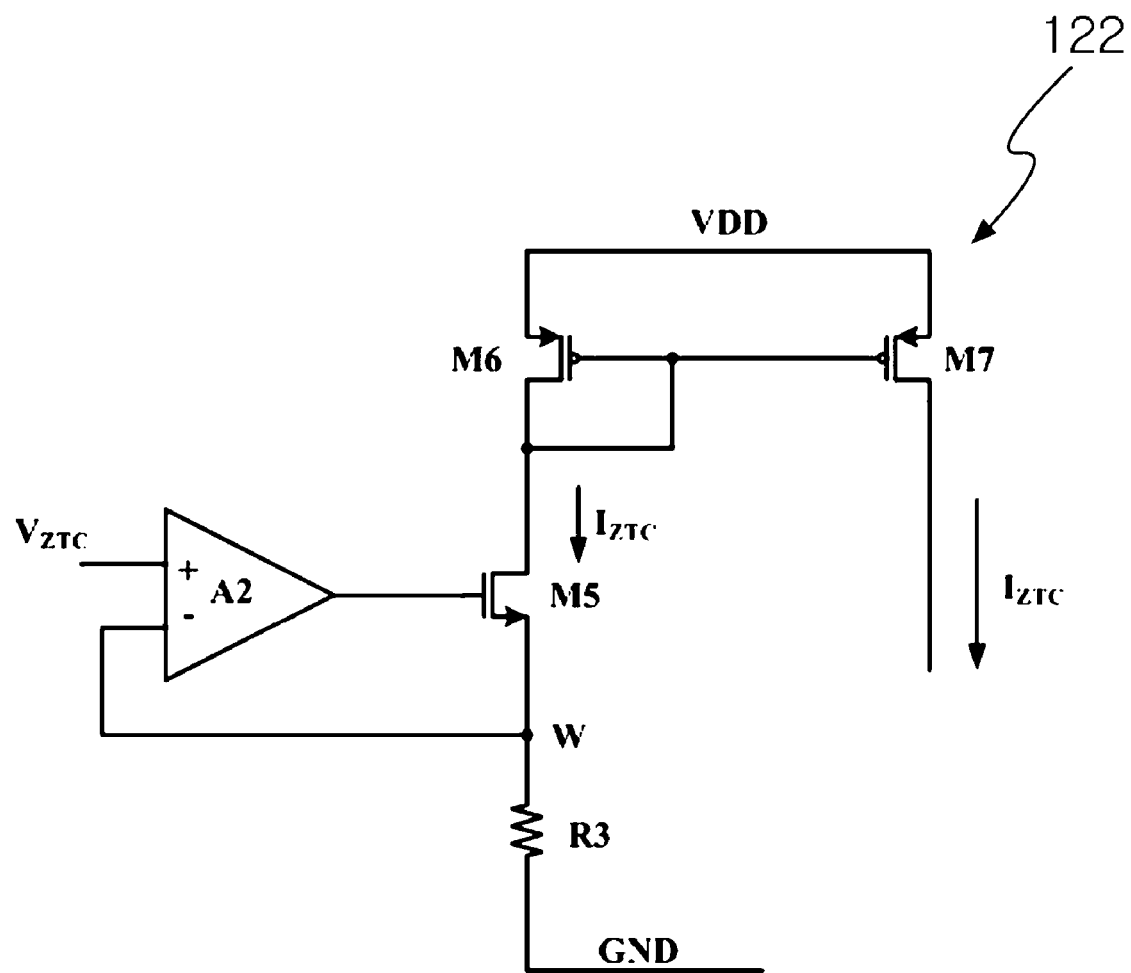
FIG. 6 is a circuit diagram illustrating a voltage-current conversion unit included in the zero temperature coefficient current generator.

FIG. 6 is a circuit diagram illustrating the voltage-current conversion unit 122 included in the ZTC current generator 12.

Referring to FIG. 6, the voltage-current conversion unit 122 may include a second operation amplification unit A2 having one input terminal where the output voltage of the ZTC voltage generation unit 121 shown in FIG. 4; a fifth MOSFET M5 having a gate terminal connected to an output terminal of the second operation amplification unit A2 and a source terminal connected to another input terminal of the second operation amplification unit A2; a sixth MOSFET M6 having a source terminal connected to the power voltage VDD and a gate terminal and a drain terminal connected to a drain terminal of the fifth MOSFET M5; a seventh MOSFET M7 having a source terminal connected to the power voltage VDD and a gate terminal connected to the gate terminal of the sixth MOSFET M6; and a third resistor R3 having one terminal connected to the source terminal of the fifth MOSFET M5 and another terminal grounded and may output a current flowing through a drain terminal of the seventh MOSFET M7 as the ZTC current $I_{ZTC}$.

In the circuit of FIG. 6, a voltage Vw of a node W has the same magnitude as the ZTC voltage $V_{ZTC}$ that is an input voltage, by the second operation amplification unit A2. Accordingly, the current $I_{ZTC}$ flowing from the source terminal to the drain terminal of the six MOSFET M6 may be expressed as following Equation 9 and mirrored to flow from the source terminal to the drain terminal of the seventh MOSFET M7. The current flowing through the drain terminal of the seventh MOSFET may be used as the output current of the ZTC current generator 12.

$$I_{ZTC} = \frac{V_{ZTC}}{R3} \quad \text{Equation (9)}$$

Figure 7:
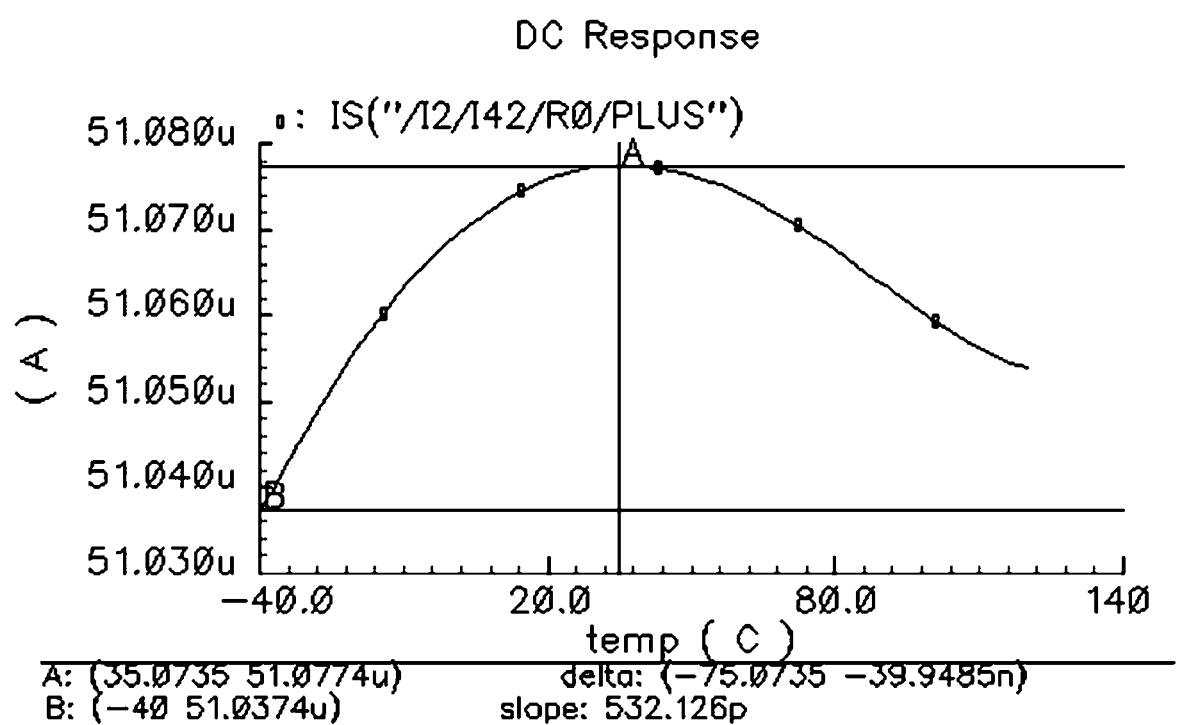
FIG. 7 is a graph illustrating current changes depending on a temperature in a current outputted from the voltage-current conversion unit of FIG. 6.

That is, since the output voltage $V_{ZTC}$ of the ZTC voltage generation unit 121 is a constant voltage regardless of a temperature, an output current $I_{ZTC}$ of the voltage-current conversion unit 122 becomes the ZTC current constant regardless of a temperature according to Equation 9. This characteristic will be shown in FIG. 7. FIG. 7 is a graph illustrating a result of simulating the output current of the voltage-current conversion unit 122 of FIG. 6. Referring to FIG. 7, it may be known that the voltage-current conversion unit 122 outputs a current actually constant regardless of a temperature, in which a difference between a maximum current and a minimum current is less than 0.05 μA, though a temperature is changed within a range from −40 to 120° C.

Referring to FIG. 1, the PTC current $I_{PTC}$ generated by the PTC current generator 11 and the ZTC current $I_{ZTC}$ generated by the ZTC current generator 12 are inputted to the ATC current generator 14.

Figure 10:
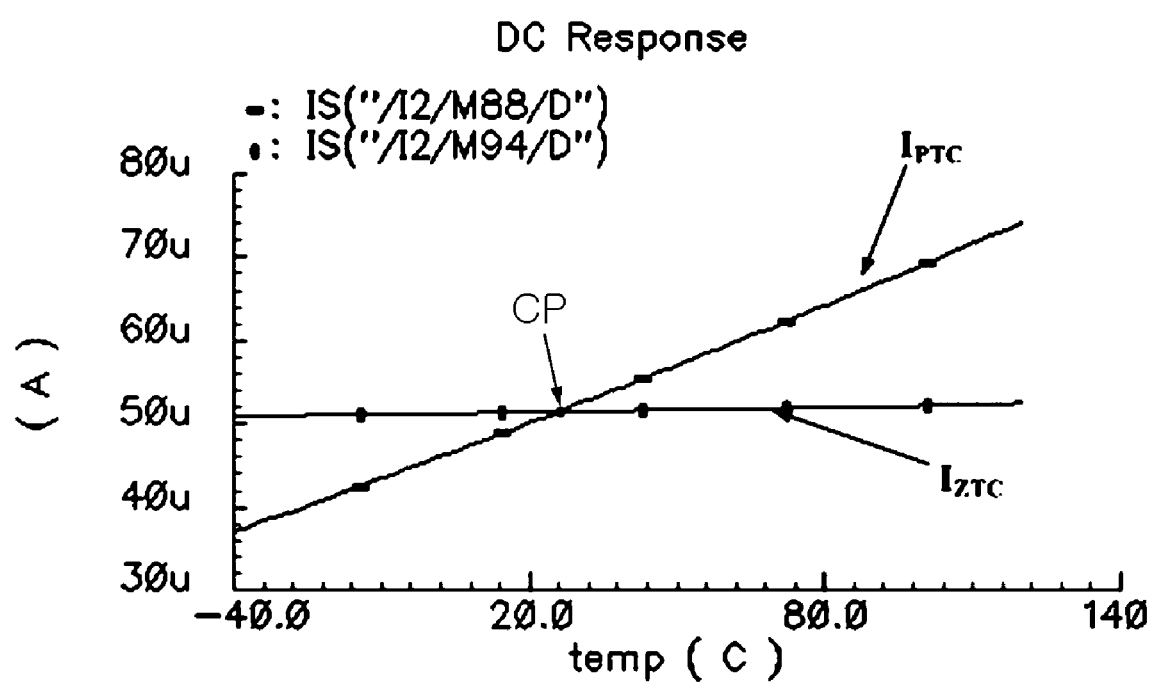
FIG. 10 is a graph illustrating a relation between a positive temperature coefficient current and a zero temperature coefficient current inputted to the adjustable temperature coefficient current generator.

FIG. 10 is a graph illustrating a temperature-current relation in the PTC current $I_{PTC}$ and the ZTC current $I_{ZTC}$ inputted to the ATC current generator 14. In FIG. 10, to appropriately adjust a crossing point CP where a straight line indicating the PTC current $I_{PTC}$ crosses a straight line indicating the ZTC current $I_{ZTC}$, the PTC current $I_{PTC}$ may be amplified by a predetermined gain K by the amplifier 13 before being inputted to the ATC current generator 14. The gain K may be adjusted in such a way that the crossing point CP the straight line indicating the PTC current $I_{PTC}$ crosses the straight line indicating the ZTC current $I_{ZTC}$, the PTC current $I_{PTC}$ is formed in a normal temperature. In below, for a brief description of the present invention, the PTC current inputted to the ATC current generator 14 is not amplified. The PTC current inputted to the ATC current generator 14 should be considered as a current amplified by a predetermined gain by an amplifier.

Figures 8A, 8B:
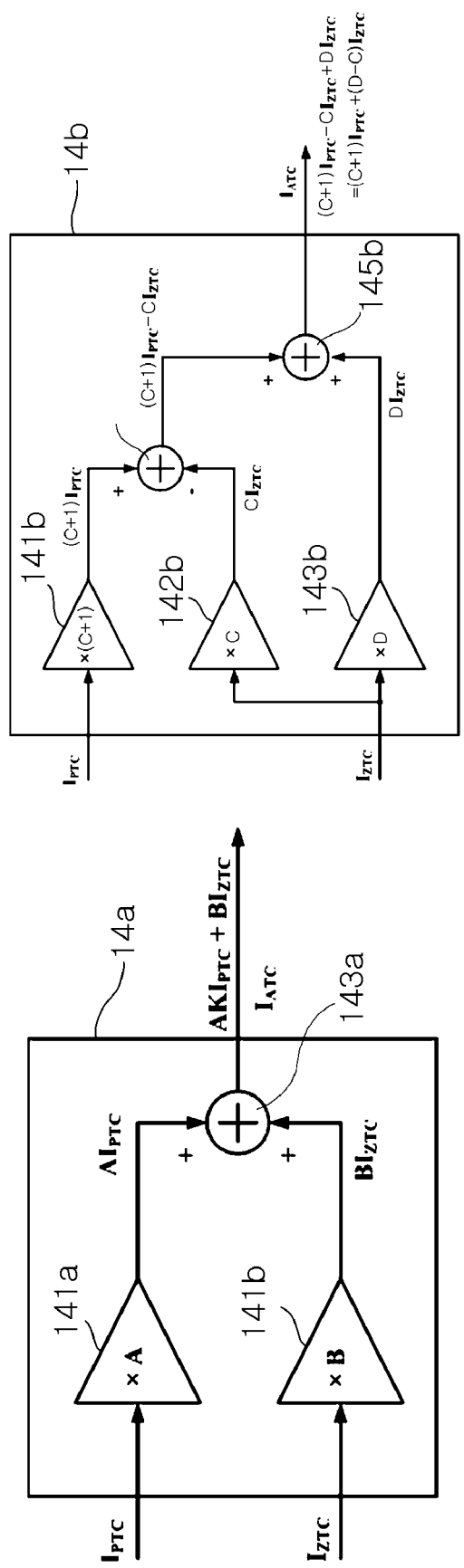
FIG. 8A is a block diagram illustrating a concept of generating an adjustable temperature coefficient current of an adjustable temperature coefficient current generator employed by an exemplary embodiment of the present invention.
FIG. 8B is a block diagram illustrating an example of generating the adjustable temperature coefficient current.

FIG. 8A is a block diagram illustrating a concept of generating the ATC current of the ATC current generator 14 employed by an exemplary embodiment of the present invention, and FIG. 8B is a block diagram illustrating an example of generating the ATC current.

As shown in FIG. 8A, basically, an ATC current generator 14a may include a first amplification unit 141a amplifying the PTC current $I_{PTC}$ by A times; a second amplification unit 142a amplifying the ZTC current $I_{ZTC}$ by B times; and an addition unit 143a generating and outputting a current by adding the amplified currents by the first and second amplification units 141a and 141b. The ATC current generator 14a may output a current having a desired temperature coefficient by adjusting the amplification gains A and B.

Also, as shown in FIG. 8B, an ATC current generator 14b may include a first amplification unit 141b amplifying an inputted PTC current $I_{PTC}$ by C+1 times; a second amplification unit 142b amplifying the zero temperature coefficient current $I_{ZTC}$ by C times; a third amplification unit 143b amplifying the ZTC $I_{ZTC}$ current by D times; a subtraction unit 144b subtracting the current amplified by the second amplification unit 142b from the current amplified by the first amplification unit 141b and outputting a current as a result thereof; and an addition unit 145b generating and outputting the ATC current by adding the current outputted by the subtraction unit 144b. This is illustrated in detail in FIG. 9.

Figure 9:
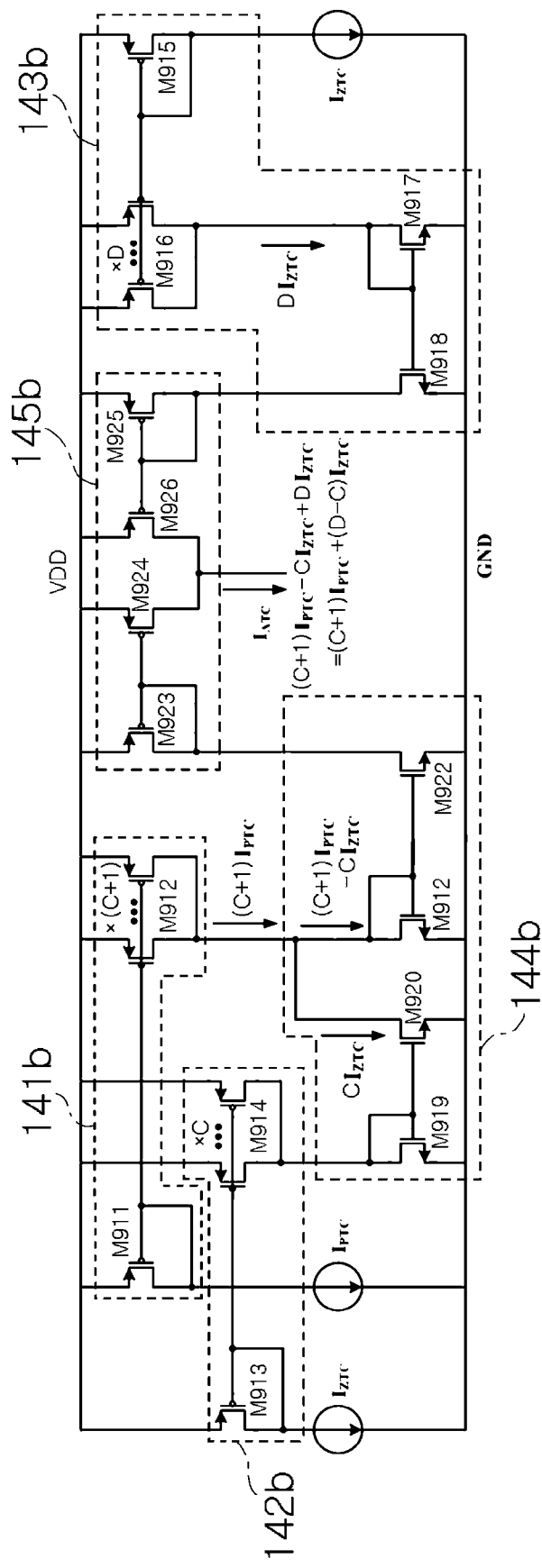
FIG. 9 is a circuit diagram illustrating the adjustable temperature coefficient current generator shown in FIG. 8B.

FIG. 9 is a circuit diagram illustrating the ATC current generator 14b of FIG. 8B.

Referring to FIG. 9, the ATC current generator 14b may be formed to include a plurality of current mirror circuits. FIG. 9 will be described by considering a relation with the ATC current generator 14b shown in FIG. 8B, as follows.

The first amplification unit 141b may be formed of a first current mirror amplifying the inputted PTC current $I_{PTC}$ by A+1 times and mirroring the amplified current. The first current mirror may include an eighth MOSFET M911 having a drain terminal where the PTC current $I_{PTC}$ is applied to, a source terminal connected to the power voltage VDD, and a gate terminal electrically connected to the drain terminal; and C+1 number of ninth MOSFETs M912 having a gate terminal connected to the gate terminal of the eighth MOSFET M911, a source terminal connected to the power voltage VDD, and a drain terminal connected to that of other ninth MOSFETs M912. Since the respective ninth MOSFETs M912 mirror a current flowing through the eighth MOSFET M911, a current outputted from the drain terminals of the plurality of the ninth MOSFETs M912, which are commonly connected to each other, is C+1 times of the PTC current $I_{PTC}$.

The second amplification unit 142b may be formed of a second current mirror amplifying the inputted ZTC current $I_{ZTC}$ by A times and mirroring the amplified current. The second current mirror may include a tenth MOSFET M913 having a drain terminal where the ZTC current $I_{ZTC}$ is applied to, a source terminal connected to the power voltage VDD, and a gate terminal electrically connected to the drain terminal; and C number of eleventh MOSFETs M914 having a gate terminal connected to the gate terminal of the tenth MOSFET M913, a source terminal connected to the power voltage, and a drain terminal connected to that of other eleventh MOSFETs M914. Similar to the first current mirror, a current outputted from a common drain terminal of the eleventh MOSFETs M914 of the second current mirror is C times of the ZTC current $I_{ZTC}$.

The third amplification unit 143b may include a current mirror circuit including a twelfth MOSFET M915 having a drain terminal where the ZTC current $I_{ZTC}$ is applied to, a source terminal connected to the power voltage VDD, and a gate terminal electrically connected to the drain terminal; and D number of thirteenth MOSFETs M916 having a gate terminal connected to the gate terminal of the twelfth MOSFET M915, a source terminal connected to the power voltage, and a drain terminal connected to that of other thirteenth MOSFETs M916; and a mirror current circuit including a fourteenth MOSFET M917 having a drain terminal where a current outputted from a common drain terminal of the thirteenth MOSFETs M916 is applied to, a gate terminal electrically connected to the drain terminal, and a source terminal grounded; and a fifteenth MOSFET M918 having a gate terminal connected to the gate terminal of the fourteenth MOSFET M917 and a source terminal grounded. Since the respective thirteenth MOSFETs M916 mirror a current flowing through the twelfth MOSFET M915, a current outputted from the common drain terminal of the D number of the thirteenth MOSFETs M916, which are commonly connected to each other, is D times of the ZTC current $I_{ZTC}$. Also, a current having the same magnitude of the current flowing through the fourteenth MOSFET M917 is mirrored and flows through the drain terminal of the fifteenth MOSFET M918. The current flowing through the drain terminal of the fifteenth MOSFET M918 becomes an output current of the third amplification unit 143b, and, at the same time, an input current of the addition unit 145b.

The subtraction unit 144b may include a current mirror circuit including a sixteenth MOSFET M919 having a drain terminal where a current outputted from the second amplification unit 142b is inputted to, a gate terminal electrically connected to the drain terminal, and a source terminal grounded and a seventeenth MOSFET M920 having a gate terminal connected to the gate terminal of the sixteenth MOSFET M919, and a source terminal grounded; and a current mirror circuit including an eighteenth MOSFET M921 having a drain terminal where a current outputted from the first amplification unit 141b is inputted to, the drain terminal connected to a drain terminal and the gate terminal of the seventeenth MOSFET M920, and a source terminal grounded and a nineteenth MOSFET M922 having a gate terminal connected to a gate terminal of the eighteenth MOSFET M921 and a source terminal grounded.

A current $C*I_{ZTC}$ of the second amplification unit 142b, flowing through the sixteenth MOSFET M919 is mirrored as the same magnitude and is allowed to flow the drain terminal of the seventeenth MOSFET M920. Also, since the drain terminal of the seventeenth MOSFET M920 and the drain terminal of the eighteenth MOSFET M921 are commonly connected to the output terminal of the first amplification unit 141b, a current obtained by subtracting the current $C*I_{ZTC}$ mirrored to the seventeenth MOSFET M920 from the current outputted from the first amplification unit 141b flows through the eighteenth MOSFET M921. Also, the current flowing through the eighteenth MOSFET M921 is mirrored and flows through the drain terminal of the nineteenth MOSFET M922. The current flowing through the nineteenth MOSFET M922 becomes an output current of the subtraction unit 144b.

The addition unit 145b includes a current mirror circuit including a twentieth MOSFET M923 having a drain terminal where the current outputted from the subtraction unit 144b, a gate terminal electrically connected to the drain terminal, and a source terminal grounded and a twenty first MOSFET M924 having a gate terminal connected to the gate terminal of the twentieth MOSFET M923 and a source terminal connected to the power voltage VDD; and a current mirror circuit including a twenty second MOSFET M925 having a drain terminal where a current outputted from the third amplification unit 143b is applied to, a gate terminal electrically connected to the drain terminal, and a source terminal connected to the power voltage VDD and a twenty third MOSFET M926 having a gate terminal connected to the gate terminal of the twenty second MOSFET M925, a source terminal connected to the power voltage VDD, and a drain terminal connected to a drain terminal of the twenty first MOSFET M924.

A current obtained by adding a current mirroring a current flowing through the twentieth MOSFET M923 to a current mirroring a current flowing through the twenty second MOSFET M925 is outputted from a common drain terminal of the twenty first MOSFET M924 and the twenty third MOSFET M926. That is, the current outputted from the common drain terminal of the twenty first MOSFET M924 and the twenty third MOSFET M926 becomes an output current of the ATC current generator 14b.

In the embodiment shown in FIGS. 8A, 8B, and 9, the amplification gains A and B with respect to the PTC current $I_{PTC}$ and the ZTC current $I_{ZTC}$ of the ATC current generator 14b are determined as Equation 10.

$$A = C+1$$

$$B = D - C \qquad \text{Equation (10)}$$

As shown in Equation 10, according to the present embodiment, by a variable factor C of the amplification gain of the PTC current $I_{PTC}$, the ZTC current $I_{ZTC}$ is amplified and subtracted and a current where the PTC current $I_{PTC}$ is moved by D may be generated. This may be more clearly understood by graphs of FIGS. 11 and 12.

Figure 11:
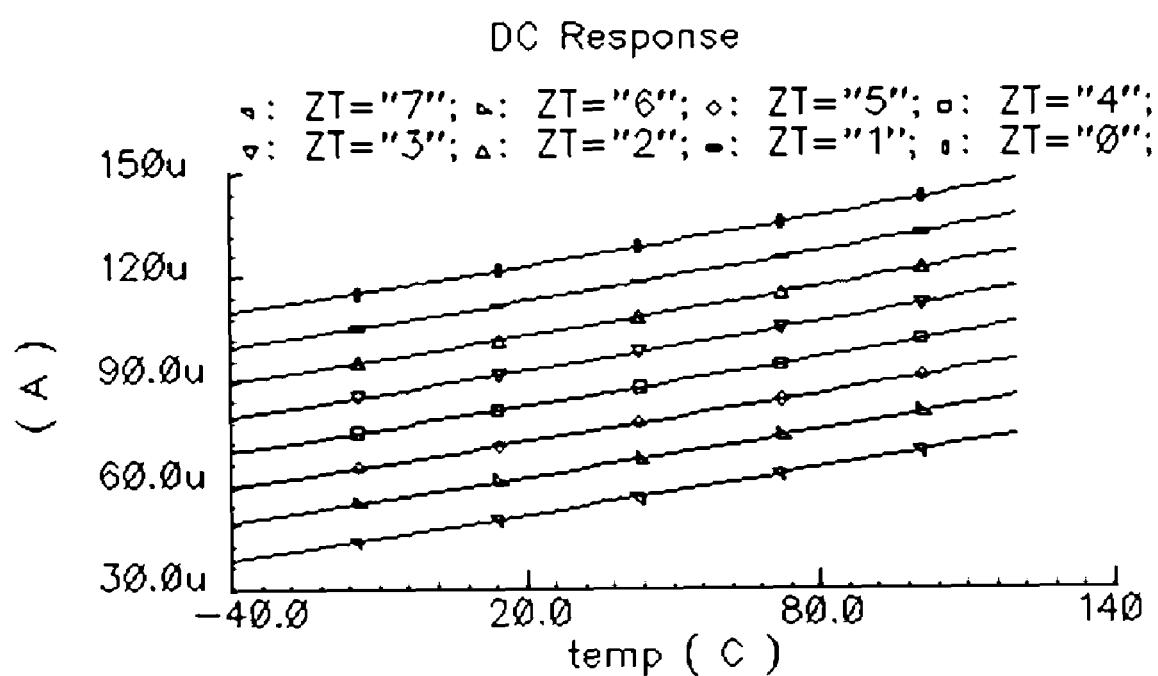
FIG. 11 is a graph illustrating an adjustable temperature coefficient current outputted from the adjustable temperature coefficient current generator of FIG. 8B when a gain C is fixed and a gain D is varied.

FIG. 11 is a graph illustrating the ATC current outputted from the ATC current generator 14b of FIG. 8B when the gain C is fixed and the gain D is varied.

As shown in FIG. 11 since the variable factor C is fixed in the amplification gain of the PTC current $I_{PTC}$ and the variable factor D of the ZTC current $I_{ZTC}$ is varied, an inclination is constant and the ATC current is moved up and down depending on the size of the variable factor D.

Figure 12:
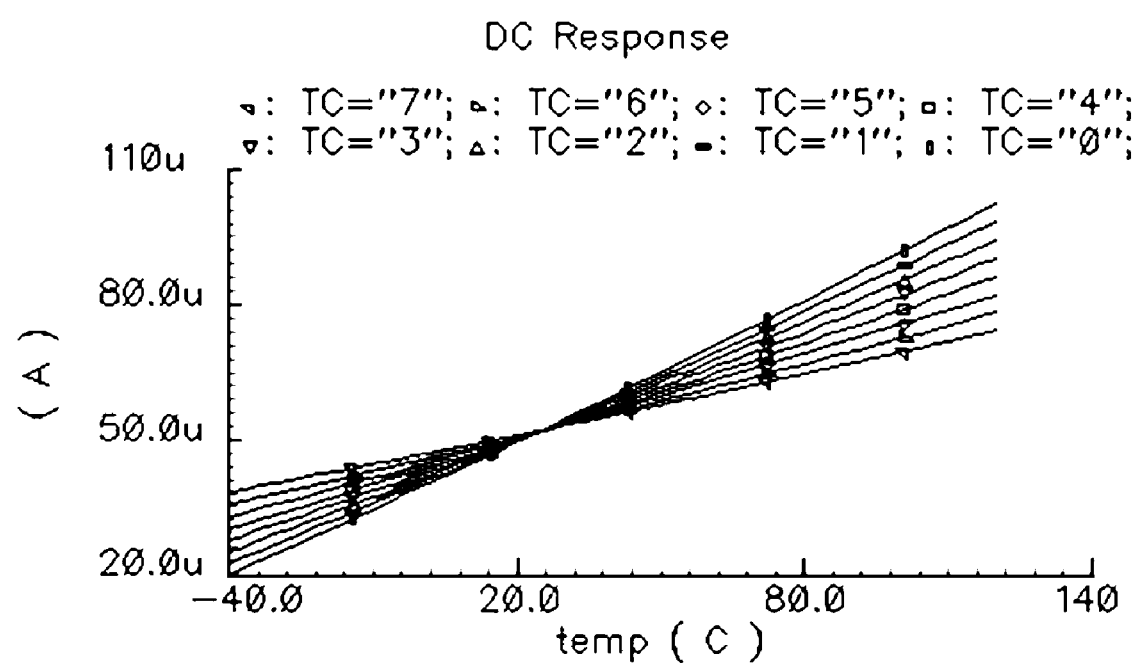
FIG. 12 is a graph illustrating an adjustable temperature coefficient current outputted from the adjustable temperature coefficient current generator of FIG. 8B when a gain D is fixed and a gain C is varied.

Also, FIG. 12 is a graph illustrating an ATC current outputted from the ATC current generator 14b of FIG. 8B when a gain D is fixed and a gain C is varied.

As shown in FIG. 12, since the variable factor C is varied in the amplification gain of the PTC current $I_{PTC}$, an inclination of the graph is varied. Since the variable factor D is fixed in the amplification gain of the ZTC and C is subtracted by a change in the inclination of the PTC current $I_{PTC}$, the ATC current is shown as straight lines having a different inclination from others, which cross each others at the same temperature according to a value of the variable factor C.

As described above, when using the characteristic according to changes in gain, the gain is appropriately adjusted, thereby generating a current having a plurality of temperature coefficients.

Figure 13:
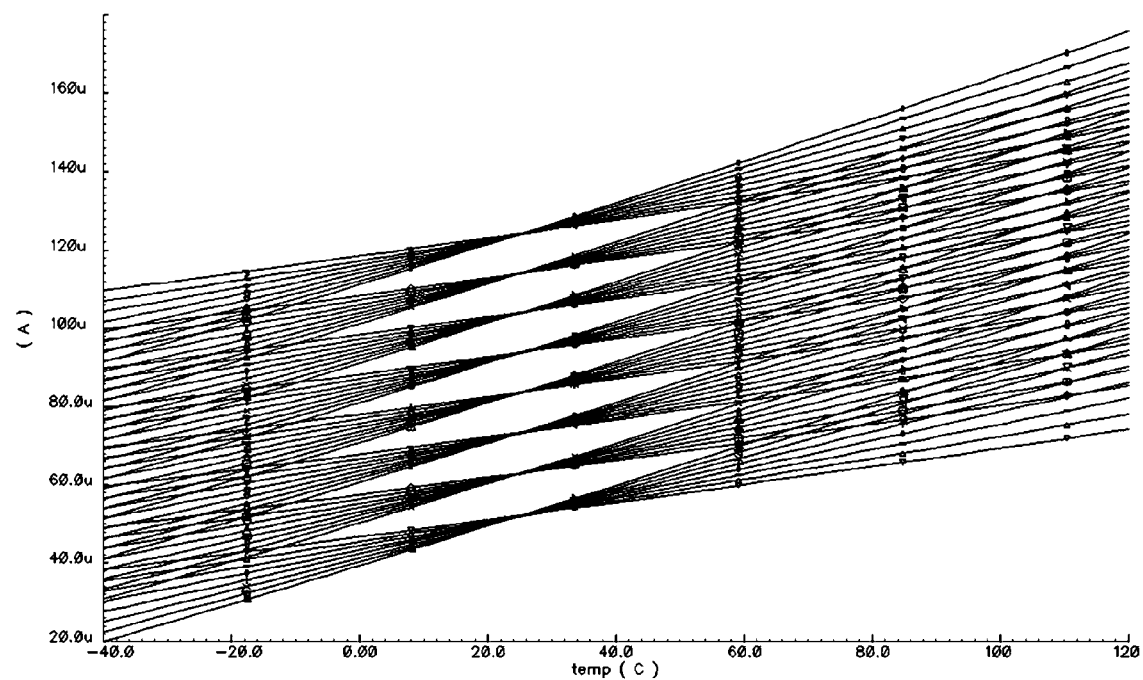
FIG. 13 is a graph illustrating an adjustable temperature coefficient current outputted from the adjustable temperature coefficient current generator of FIG. 8B when a gain C and a gain D are varied by a 3-bit control.

FIG. 13 is a graph illustrating an ATC current outputted from the ATC current generator 14b of FIG. 8B when a gain C and a gain D are varied by a 3-bit control.

As shown in FIG. 13, when the size of the gain C is adjusted to 3 bits, that is, 8 stages ($2^3=8$) and the size of the gain D is adjusted to 3 bits, eight crossing points having a different current at the same temperature are formed and eight straight lines having a different inclination for each crossing point are formed, thereby generating a current having total 64 of different temperature coefficients.

In this case, values of the gains C and D may be adjusted by adjusting the respective numbers of the ninth MOSFET M912, the eleventh MOSFET M914, and the thirteenth MOSFET M916 in the current mirror circuit included in each amplification unit in the ATC current generator using the current mirror shown in FIG. 9. For example, switches are provided between the drain terminal and the power voltage VDD in each of the ninth MOSFET M912, the eleventh MOSFET M914, and the thirteenth MOSFET M916 and are selectively turned on and off, thereby determining the amplification gain.

As described above, according to an exemplary embodiment of the present invention, there is provided a current having various temperature coefficients by appropriately controlling a gain of each of a current having a PTC and a current having a ZTC. A bias current where various characteristic changes are compensated in various circuits having different characteristic changes may be provided by applying the current generating apparatus.

While the present invention has been shown and described in connection with the exemplary embodiments, it will be apparent to those skilled in the art that modifications and variations can be made without departing from the spirit and scope of the invention as defined by the appended claims.

What is claimed is:

1. A bias current generating apparatus with an adjustable temperature coefficient, the apparatus comprising:
    a positive temperature coefficient current generator generating a positive temperature coefficient current in direct proportion to an absolute temperature;
    a zero temperature coefficient current generator generating a zero temperature coefficient current constant regardless of the absolute temperature; and
    an adjustable temperature coefficient current generator generating and outputting an adjustable temperature coefficient current by amplifying the positive temperature coefficient current by A times, amplifying the zero temperature coefficient current by B times, adding the two amplified temperature coefficient currents,
    wherein a temperature coefficient of the adjustable temperature coefficient current is selectively varied by adjusting sizes of the A and B.

2. The apparatus of claim 1, wherein the positive temperature coefficient current generator comprises:
    first and second metal-oxide semiconductor field effect transistors (MOSFETs) having a source terminal connected to a power voltage;
    a first operation amplification unit having input terminals connected to drain terminals of the first and second MOSFETs, respectively, and an output terminal connected to gate terminals of the first and second MOSFETs;
    a first bipolar junction transistor (BJT) having a base and a collector connected to the drain terminal of the first MOSFET and an emitter grounded;
    a first resistor having one terminal connected to the drain terminal of the second MOSFET; and
    a plurality of second BJTs having a base and a collector connected to another terminal of the first resistor and an emitter grounded,
    wherein a current flowing between the source terminal and the drain terminal of the first and second MOSFETs is outputted as the positive temperature coefficient current.

3. The apparatus of claim 2, wherein the zero temperature coefficient current generator comprises:
    a zero temperature coefficient voltage generation unit generating a zero temperature coefficient voltage constant regardless of the absolute temperature by using the positive temperature coefficient current; and
    a voltage-current conversion unit converting the zero temperature coefficient voltage into the zero temperature coefficient current and outputting the zero temperature coefficient current.

4. The apparatus of claim 3, wherein the zero temperature coefficient voltage generation unit comprises:
    a third MOSFET having a drain terminal where the positive temperature coefficient current generated by the positive temperature coefficient current generator is applied to, a source terminal connected to the power voltage, and a gate terminal connected to the drain terminal;
    a fourth MOSFET having a source terminal connected to the power voltage and a gate terminal connected to the gate terminal of the third MOSFET;
    a second resistor having one terminal connected to a drain terminal of the fourth MOSFET; and
    a third BJT having a base and a collector connected to another terminal of the second resistor, and an emitter grounded,
    wherein a voltage of the drain terminal of the fourth MOSFET is determined to be the zero temperature coefficient voltage regardless of the absolute temperature by adjusting resistance values of the first and second resistors and a number of the second BJTs.

5. The apparatus of claim 4, wherein the voltage-current conversion unit comprises:
    a second operation amplification unit having one input terminal connected to the drain terminal of the fourth MOSFET of the zero temperature coefficient voltage generation unit to receive a voltage of the drain terminal of the fourth MOSFET;
    a fifth MOSFET having a gate terminal connected to an output terminal of the second operation amplification unit and a source terminal connected to another input terminal of the second operation amplification unit;
    a sixth MOSFET having a source terminal connected to the power voltage and a gate terminal and a drain terminal connected to a drain terminal of the fifth MOSFET;
    a seventh MOSFET having a source terminal connected to the power voltage and a gate terminal connected to the gate terminal of the sixth MOSFET; and
    a third resistor having one terminal connected to the source terminal of the fifth MOSFET and another terminal grounded,
    wherein a current flowing through a drain terminal of the seventh MOSFET is outputted as the zero temperature coefficient current.

6. The apparatus of claim 1, further comprising an amplifier amplifying the positive temperature coefficient current by a predetermined gain.

7. The apparatus of claim 6, wherein the gain is determined to form a crossing point where a straight line indicating the positive temperature coefficient current crosses a straight line indicating the zero temperature coefficient current, in a normal temperature.

8. The apparatus of claim 1, wherein the adjustable temperature coefficient current generator comprises:
    a first amplification unit amplifying the positive temperature coefficient current by the A times;
    a second amplification unit amplifying the zero temperature coefficient current by the B times; and
    an addition unit generating and outputting the adjustable temperature coefficient current by adding the amplified currents by the first and second amplification units, wherein the temperature coefficient of the adjustable temperature coefficient current is determined by adjusting the sizes of the A and B.

9. The apparatus of claim 1, wherein the adjustable temperature coefficient current generator comprises:
a first amplification unit amplifying the positive temperature coefficient current by C+1 times;
a second amplification unit amplifying the zero temperature coefficient current by C times;
a third amplification unit amplifying the zero temperature coefficient current by D times;
a subtraction unit subtracting the current amplified by the second amplification unit from the current amplified by the first amplification unit and outputting a current as a result thereof and
an addition unit generating and outputting the adjustable temperature coefficient current by adding the current outputted by the subtraction unit and a current outputted by the third amplification unit,
wherein the sizes of the A and B are determined by following Equation, $A=C+1$ $B=D-C$, and the temperature coefficient of the adjustable temperature coefficient current is determined by adjusting sizes of the C and D.

10. The apparatus of claim 9, wherein the first amplification unit is a current mirror circuit comprising:
an eighth MOSFET having a drain terminal where the positive temperature coefficient current is applied to, a source terminal connected to the power voltage, and a gate terminal electrically connected to the drain terminal; and
C+1 number of ninth MOSFETs having a gate terminal connected to the gate terminal of the eighth MOSFET, a source terminal connected to the power voltage, and a drain terminal connected to that of other ninth MOSFETs.

11. The apparatus of claim 9, wherein the second amplification unit is a current mirror circuit comprising:
a tenth MOSFET having a drain terminal where the zero temperature coefficient current is applied to, a source terminal connected to the power voltage, and a gate terminal electrically connected to the drain terminal; and
C number of eleventh MOSFETs having a gate terminal connected to the gate terminal of the tenth MOSFET, a source terminal connected to the power voltage, and a drain terminal connected to that of other eleventh MOSFETs.

12. The apparatus of claim 9, wherein the third amplification unit comprises:
a current mirror circuit comprising a twelfth MOSFET having a drain terminal where the zero temperature coefficient current is applied to, a source terminal connected to the power voltage, and a gate terminal electrically connected to the drain terminal; and D number of thirteenth MOSFETs having a gate terminal connected to the gate terminal of the twelfth MOSFET, a source terminal connected to the power voltage, and a drain terminal connected to that of other thirteenth MOSFETs; and
a mirror current circuit comprising a fourteenth MOSFET having a drain terminal where a current outputted from a common drain terminal of the thirteenth MOSFETs is applied to, a gate terminal electrically connected to the drain terminal, and a source terminal grounded; and a fifteenth MOSFET having a gate terminal connected to the gate terminal of the fourteenth MOSFET and a source terminal grounded.

13. The apparatus of claim 9, wherein the subtraction unit comprises:
a current mirror circuit comprising a sixteenth MOSFET having a drain terminal where a current outputted from the second amplification unit is inputted to, a gate terminal electrically connected to the drain terminal, and a source terminal grounded and a seventeenth MOSFET having a gate terminal connected to the gate terminal of the sixteenth MOSFET, and a source terminal grounded; and
a current mirror circuit comprising an eighteenth MOSFET having a drain terminal where a current outputted from the first amplification unit is inputted to, the drain terminal connected to a drain terminal and the gate terminal of the seventeenth MOSFET, and a source terminal grounded and a nineteenth MOSFET having a gate terminal connected to a gate terminal of the eighteenth MOSFET and a source terminal grounded.

14. The apparatus of claim 9, wherein the addition unit comprises:
a current mirror circuit comprising a twentieth MOSFET having a drain terminal where the current outputted from the subtraction unit, a gate terminal electrically connected to the drain terminal, and a source terminal grounded and a twenty first MOSFET having a gate terminal connected to the gate terminal of the twentieth MOSFET and a source terminal connected to the power voltage; and
a current mirror circuit comprising a twenty second MOSFET having a drain terminal where a current outputted from the third amplification unit is applied to, a gate terminal electrically connected to the drain terminal, and a source terminal connected to the power voltage and a twenty third MOSFET having a gate terminal connected to the gate terminal of the twenty second MOSFET, a source terminal connected to the power voltage, and a drain terminal connected to a drain terminal of the twenty first MOSFET,
wherein a current outputted from a common drain terminal of the twenty first MOSFET and the twenty third MOSFET is a current outputted from the adjustable temperature coefficient current generator.

* * * * *